(12) United States Patent
Chen

(10) Patent No.: US 10,475,792 B2
(45) Date of Patent: Nov. 12, 2019

(54) POWER TRANSISTOR DEVICE

(71) Applicant: UBIQ Semiconductor Corp., Hsinchu County (TW)

(72) Inventor: Chin-Fu Chen, Hsinchu County (TW)

(73) Assignee: UBIQ Semiconductor Corp., Hsinchu County (TW)

(*) Notice: Subject to any disclaimer, the term of this patent is extended or adjusted under 35 U.S.C. 154(b) by 0 days.

(21) Appl. No.: 16/157,104

(22) Filed: Oct. 11, 2018

(65) Prior Publication Data

US 2019/0043859 A1 Feb. 7, 2019

Related U.S. Application Data

(63) Continuation-in-part of application No. 15/873,910, filed on Jan. 18, 2018, now Pat. No. 10,269,945.

(30) Foreign Application Priority Data

Jun. 8, 2017 (TW) .............................. 106118980 A

(51) Int. Cl.
| | |
|---|---|
| H01L 27/088 | (2006.01) |
| H01L 27/02 | (2006.01) |
| H01L 29/78 | (2006.01) |
| H01L 29/06 | (2006.01) |
| H01L 29/66 | (2006.01) |
| H01L 29/417 | (2006.01) |

(52) U.S. Cl.
CPC ...... *H01L 27/0886* (2013.01); *H01L 27/0207* (2013.01); *H01L 29/0634* (2013.01); *H01L 29/0649* (2013.01); *H01L 29/41791* (2013.01); *H01L 29/66666* (2013.01); *H01L 29/7827* (2013.01); *H01L 29/7851* (2013.01)

(58) Field of Classification Search
CPC .......... H01L 29/0634; H01L 29/66666; H01L 29/7827; H01L 29/0649; H01L 27/0886; H01L 27/0207
See application file for complete search history.

(56) References Cited

U.S. PATENT DOCUMENTS

| | | | | |
|---|---|---|---|---|
| 10,249,755 B1 * | 4/2019 | Cheng | ................. | H01L 29/0847 |
| 2014/0097518 A1 * | 4/2014 | Cheng | ................. | H01L 27/0886 |
| | | | | 257/618 |
| 2014/0374831 A1 * | 12/2014 | Liaw | .................... | H01L 27/1104 |
| | | | | 257/368 |

* cited by examiner

*Primary Examiner* — Kyoung Lee
*Assistant Examiner* — Christina A Sylvia
(74) *Attorney, Agent, or Firm* — JCIPRNET

(57) ABSTRACT

Provided is a power transistor device including a substrate structure, a first conductive layer, a second conductive layer and a third conductive layer. The substrate structure has a base portion and fin portions. The fin portions protrude from a surface of the base portion and extend along a first direction. The first conductive layer is disposed across the fin portions and extends along a second direction different from the first direction. The second conductive layer is disposed across the fin portions, is located at one side of the first conductive layer and extends along the second direction. The first spacer is disposed between and in physical contact with the first conductive layer and the second conductive layer.

20 Claims, 12 Drawing Sheets

POWER TRANSISTOR DEVICE

CROSS-REFERENCE TO RELATED APPLICATION

This application is a continuation-in-part application of and claims the priority benefit of U.S. application Ser. No. 15/873,910, filed on Jan. 18, 2018, now pending, which claims the priority benefit of Taiwan application serial no. 106118980, filed on Jun. 8, 2017. The entirety of each of the above-mentioned patent applications is hereby incorporated by reference herein and made a part of this specification.

BACKGROUND OF THE INVENTION

Field of the Invention

The invention relates to a semiconductor structure and particularly relates to a power transistor device.

Description of Related Art

The power switch transistor has already been widely used in the field of power management, in which an ideal power switch should have the characteristics of low on-resistance and high breakdown voltage, so as to ensure the power conversion efficiency of the power management circuit and to provide an excellent current-handling capacity. In addition, the conventional transistor device remains unidirectionally conductive when the transistor is in a turn-off state because the conventional transistor device has a body diode. In order to enable a switch device to be in a bidirectionally turn-off state, a pair of transistors connected in series is usually required to achieve said effects. However, such a structure enhances the on-resistance of the transistor device and complicates the control thereof. In light of the above, people having ordinary skill in the art have been researching on how to reduce the on-resistance of the transistor device and enhance the bidirectional breakdown voltage thereof.

SUMMARY OF THE INVENTION

The invention provides a power transistor device having a low on-resistance (Ron) and a high bidirectional voltage withstanding capability.

The invention provides a power transistor device including a substrate structure, a first conductive layer, a second conductive layer and a third conductive layer. The substrate structure has a base portion and fin portions. The fin portions protrude from a surface of the base portion and extend along a first direction. The first conductive layer is disposed across the fin portions and extends along a second direction different from the first direction. The second conductive layer is disposed across the fin portions, is located at one side of the first conductive layer and extends along the second direction. The first spacer is disposed between and in physical contact with the first conductive layer and the second conductive layer.

According to an embodiment of the invention, the power transistor device further includes a first dielectric layer disposed between the first conductive layer and the fin portions, and a second dielectric layer disposed between the second conductive layer and the fin portions.

According to an embodiment of the invention, a thickness the first dielectric layer is different from a thickness of the second dielectric layer.

According to an embodiment of the invention, a thickness the first dielectric layer is the same as a thickness of the second dielectric layer.

According to an embodiment of the invention, the power transistor device, further includes a third conductive layer and a second spacer. The third conductive layer is disposed across the fin portions at another side of the first conductive layer and extends along the second direction. The second spacer is disposed between and in physical contact with the first conductive layer and the third conductive layer.

According to an embodiment of the invention, the power transistor device further includes a fourth conductive layer and a fifth conductive layer disposed on the base portion at outer sides of the second and third conductive layers.

According to an embodiment of the invention, the second conductive layer is electrically coupled to the fifth conductive layer, and the third conductive layer is electrically coupled to the fourth conductive layer.

According to an embodiment of the invention, the fourth conductive layer and the fifth conductive layer further extend onto top surfaces of the fin portions.

According to an embodiment of the invention, the power transistor device further includes a third spacer disposed between and in physical contact with the second conductive layer and the fourth conductive layer, and a fourth spacer disposed between and in physical contact with the third conductive layer and the fifth conductive layer.

According to an embodiment of the invention, the power transistor device further includes a fourth dielectric layer disposed between fourth conductive layer and the base portion, and a fifth dielectric layer disposed between the fifth conductive layer and the base portion.

According to an embodiment of the invention, the power transistor device further includes a first well region and a second well region disposed in the substrate structure separately from each other, and the first well region surrounds the fourth conductive layer, and the second well region surrounds the fifth conductive layer.

The invention further provides a power transistor device including a substrate structure, a first conductive layer, a second conductive layer, a third conductive layer, a fourth conductive layer and a fifth conductive layer. The substrate structure has first fin portions, second fin portions and third fin portions extending along a first direction, and the first fin portions are between and separated from the second fin portions and the third fin portions. The first conductive layer is disposed across the first fin portions. The second conductive layer and the third conductive layer are disposed across the first fin portions and at two sides of the first conductive layer. The fourth conductive layer is disposed between the first fin portions and the second fin portions. The fifth conductive layer is disposed between the first fin portions and the third fin portions.

According to an embodiment of the invention, the power transistor device further includes a first dielectric layer disposed between the first conductive layer and the substrate structure, a second dielectric layer disposed between the second conductive layer and the substrate structure, and a third dielectric layer disposed between the third conductive layer and the substrate structure, a thickness of the first dielectric layer is less than a thickness of the second dielectric layer or the third dielectric layer.

According to an embodiment of the invention, the first conductive layer and the second conductive layer are spaced from each other by a first spacer, and the first conductive layer and the third conductive layer are spaced from each other by a second spacer.

According to an embodiment of the invention, the second conductive layer and the fourth conductive layer are spaced from each other by a third spacer, and the third conductive layer and the fifth conductive layer are spaced from each other by a fourth spacer.

According to an embodiment of the invention, the second conductive layer is electrically coupled to the fifth conductive layer, and the third conductive layer is electrically coupled to the fourth conductive layer.

According to an embodiment of the invention, the power transistor device further includes a fourth dielectric layer disposed between fourth conductive layer and the base portion, a fifth dielectric layer disposed between the fifth conductive layer and the base portion, a first well region disposed in the substrate structure and surrounding the fourth conductive layer, and a second well region disposed in the substrate structure and surrounding the fifth conductive layer.

The invention further provides a power transistor device including a substrate structure, a first conductive layer and a second conductive layer. The substrate structure has first trenches extending along a first direction, a second trench extending along a second direction different from the first direction, and a third trench extending along the second direction. The substrate structure includes a base portion and fin portions extending along the first direction and protruding from a surface of the base portion, and each fin portion is disposed between two adjacent first trenches and between the second trench and the third trench. The first conductive layer is disposed across the fin portions. The second conductive layer and the third conductive layer are disposed across the fin portions and located at two sides of the first conductive layer. Besides, the substrate structure, the first conductive layer, the second conductive layer and the third conductive layer are separated from each other.

According to an embodiment of the invention, the first conductive layer and the second conductive layer are separated by a first spacer, and the first conductive layer and the third conductive layer are separated by a second spacer.

According to an embodiment of the invention, the first conductive layer and the substrate structure are separated by a first dielectric layer, the second conductive layer and the substrate structure are separated by a second dielectric layer, and the third conductive layer and the substrate structure are separated by a third dielectric layer.

Based on the above, in the power transistor device of the invention, the surface area of the substrate structure is enlarged because of the fin portions, so that the current channel width may be expanded effectively, and the Ron of the power transistor device may be further reduced effectively.

In addition, the second conductive layer and the third conductive layer are disposed as shielding gates on the fin portions and are respectively located at the opposite sides of the first conductive layer, so as to assist in controlling the carrier concentration of the fin portions during operation. As such, the Ron of the power transistor device may be reduced effectively.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
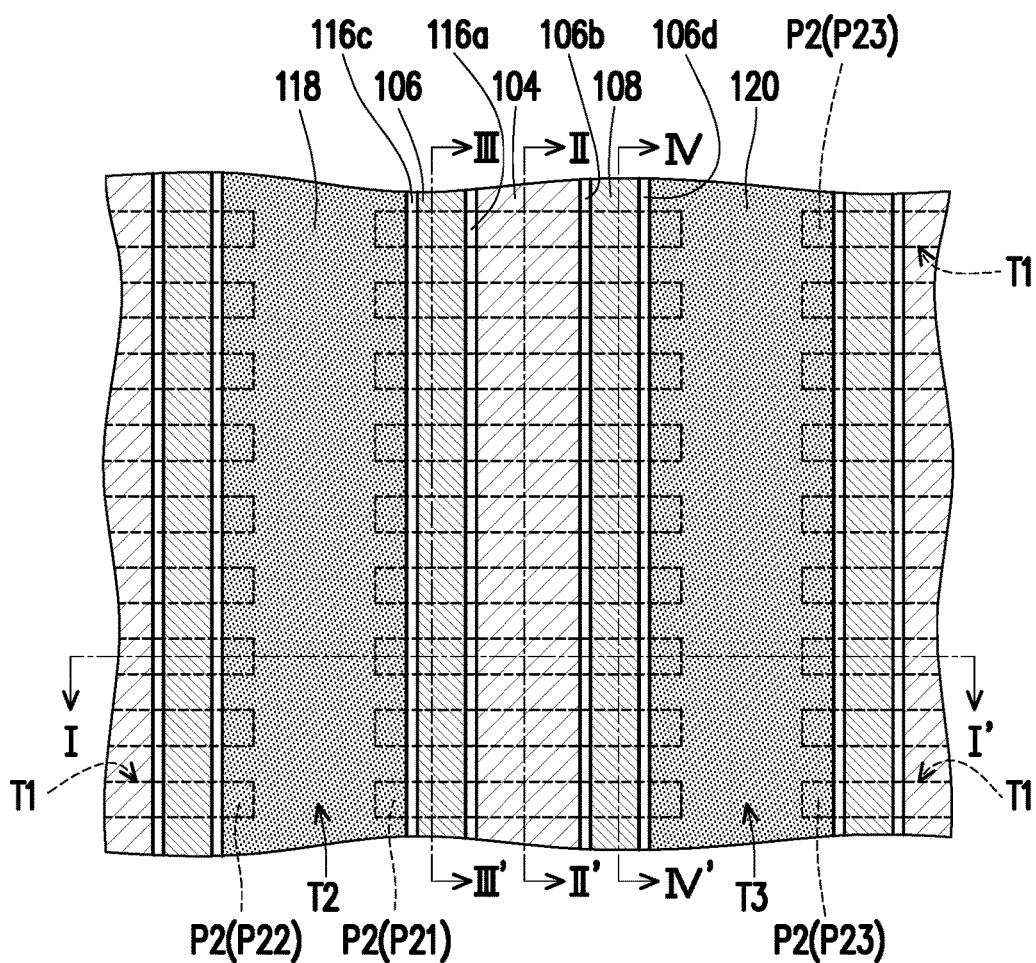
FIG. 1 is a simplified top view of a power transistor device according to an embodiment of the invention.
Figure 2:
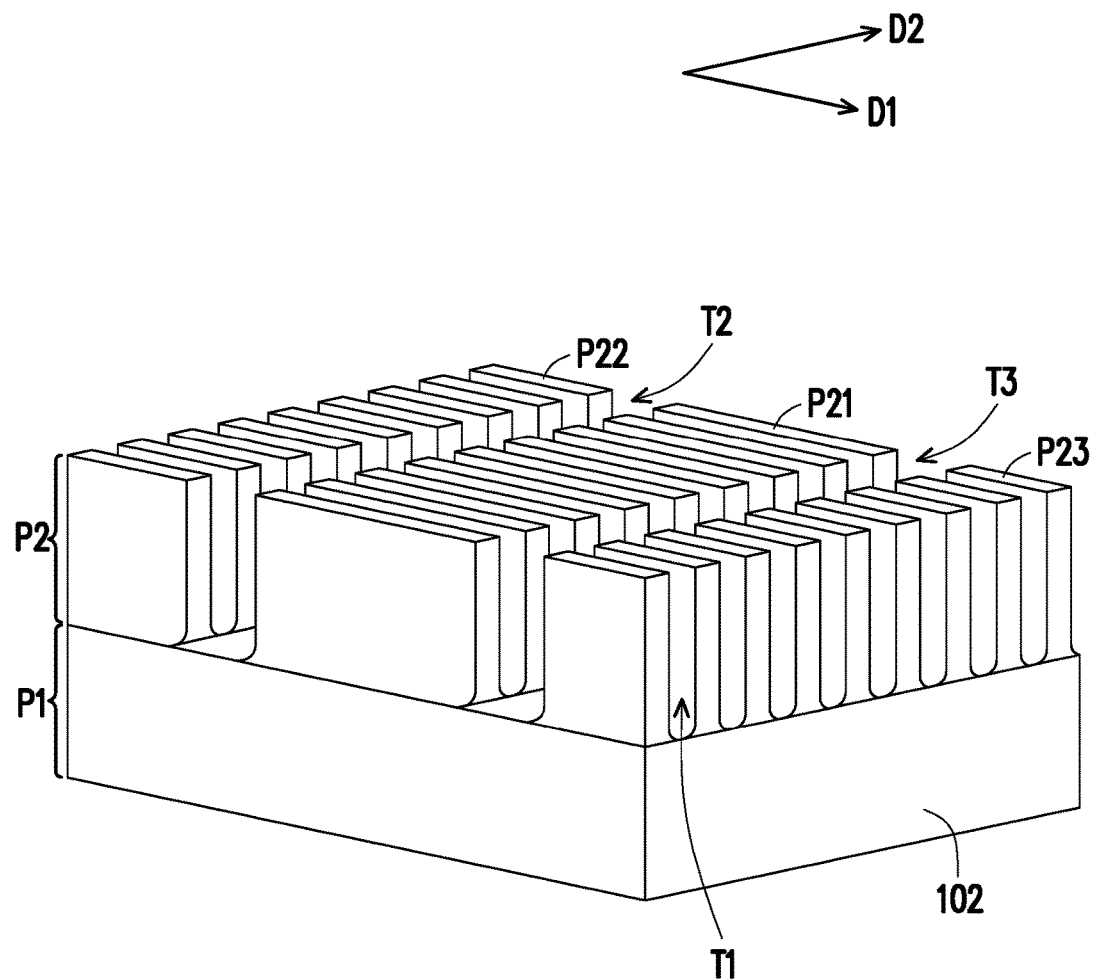
FIG. 2 is a three-dimensional view of a substrate structure of a power transistor device according to an embodiment of the invention.
Figure 3:
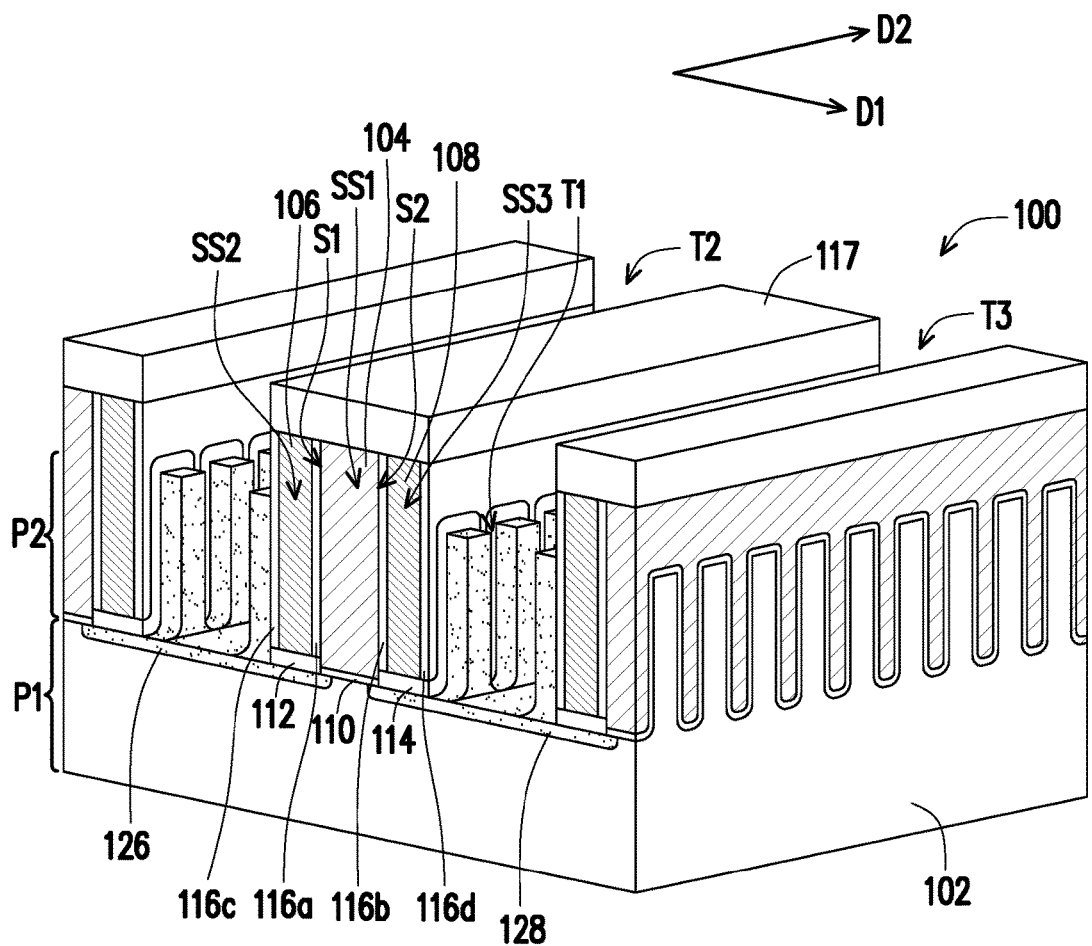
FIG. 3 is a simplified three-dimensional view of a power transistor device according to an embodiment of the invention.
Figure 11:
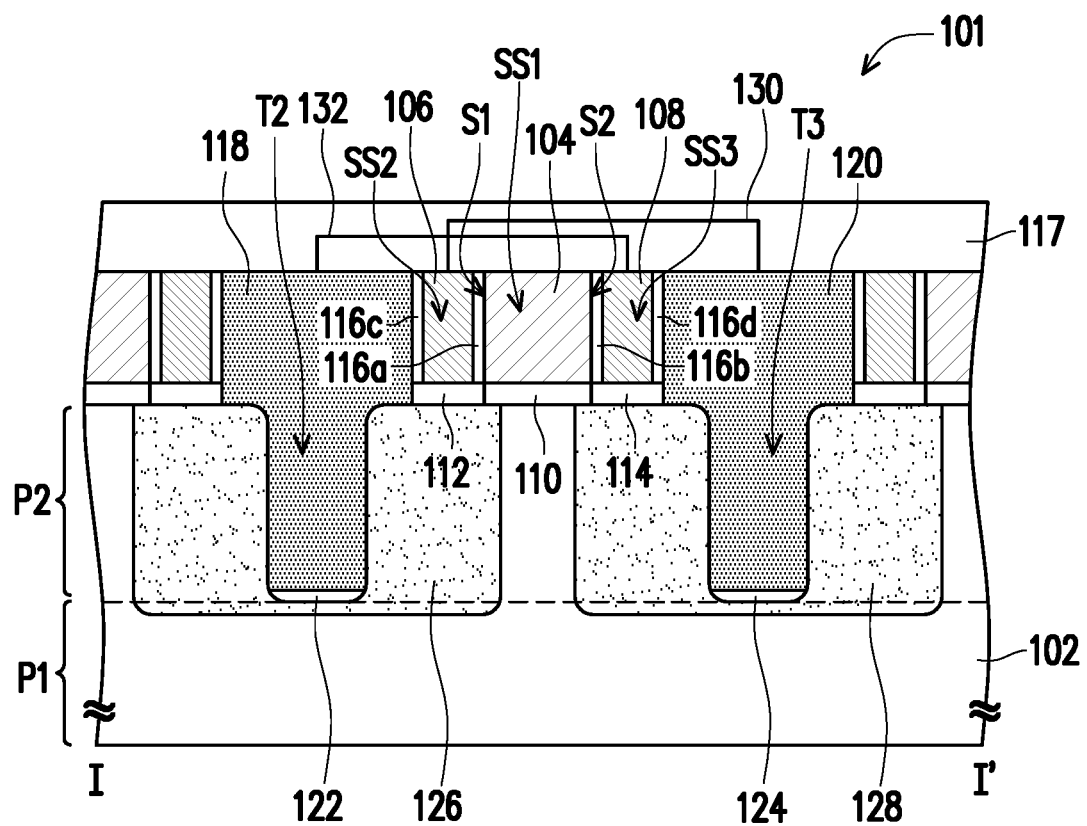
FIG. 11 is a cross-sectional view of a power transistor device sectioned along a sectional line I-I' of FIG. 1 according to another embodiment of the invention.

FIG. 1 is a simplified top view of a power transistor device according to an embodiment of the invention. For simplicity and clarity of illustration, only few elements such as fin portions, first to fourth spacers and first to fifth conductive layers are shown in the simplified top view of FIG. 1, and these elements are not necessarily in the same plane. FIG. 2 is a three-dimensional view of a substrate structure of a power transistor device according to an embodiment of the invention. FIG. 3 is a simplified three-dimensional view of a power transistor device according to an embodiment of the invention. FIG. 4 to FIG. 10 are different three-dimensional views and cross-sectional views of a power transistor device respectively sectioned along sectional lines I-I', III-III' and IV-IV' of FIG. 1 according to an embodiment of the invention. FIG. 11 is a cross-sectional views of a power transistor device sectioned along sectional lines I-I' of FIG. 1 according to another embodiment of the invention.

As shown in FIG. 1, FIG. 2, FIG. 3 and FIG. 4, a power transistor device 100 includes a substrate structure 102, a first conductive layer 104, a second conductive layer 106, and a third conductive layer 108. The power transistor device 100 may be an N-type metal-oxide-semiconductor (NMOS) transistor or a P-type metal-oxide-semiconductor (PMOS) transistor. In this embodiment, an NMOS transistor is taken as an example of the power transistor device 100.

The substrate structure 102 has a base portion P1 and fin portions P2. The fin portions P2 protrude from the surface of the base portion P1. The number of the fin portions P2 may be one or more. In this embodiment, there may be multiple fin portions P2, for instance. The fin portions P2 may extend along a first direction D1. Specifically, a first trench T1 is disposed between two adjacent fin portions P2. In other words, multiple fin portions P2 and multiple first trenches T1 are arranged alternately and extend along the first direction D1.

In an embodiment, the fin portions P2 include fin portions P21, fin portions P22 and fin portions P23, and the fin portions P21 are located between and separated from the fin portions P22 and the fin portions P23. The fin portions P21 are referred to as first fin portions, the fin portions P22 are referred to as second fin portions, and the fin portions P23 are referred to as third fin portions in some examples. It will be understood that although the terms first, second, third etc. may be used herein to describe various elements, these elements should not be limited by these terms. These terms are only used to distinguish one element from another element. Thus, a first element in some example embodiments could be termed a second element in other embodiments without departing from the teachings of the inventive concepts.

In this embodiment, the fin portions P21 and the fin portions P22 are spaced by a second trench T2, the fin portions P21 and the fin portions P23 are spaced by a third trench T3, and the second trench T2 and the third trench T3 extend along a second direction D2 different from the first direction D1. In an embodiment, the second direction D2 is perpendicular to the first direction D1. In an embodiment, ends of the fin portions P21 face ends of the fin portions P22, and opposite ends of the fin portions P21 face ends of the fin portions P23, but the invention is not limited thereto. Specifically, ends of the fin portions P21 are not necessary to face ends of the fin portions P22 or the fin portions P23.

From another point of view, as shown in FIG. 2, the substrate structure 102 includes multiple first trenches T1, a second trench T2 and a third trench T3. The second trench T2 and the third trench T3 extend along the second direction D2. The first trenches T1 extend along the first direction D1 and are located between and outside of the second trench T2 and the third trench T3. The fin portions P21 are disposed between the second trench T2 and the third trench T3, and the fin portions P22 and the fin portions P23 are disposed at outer sides of the second trench T2 and the third trench T3.

The substrate structure 102 may include a substrate (not shown) and an epitaxial layer (not shown) over the substrate. The substrate may be a semiconductor substrate, such as a silicon substrate. The epitaxial layer is disposed on the substrate. The substrate may be a P-type substrate or an N-type substrate, and the epitaxial layer may be a P-type epitaxial layer or an N-type epitaxial layer. In this embodiment, a P-type substrate is taken as an example of the substrate, and a P-type epitaxial layer is taken as an example of the epitaxial layer. In an embodiment, the fin portions P2 are constituted by an upper portion of the epitaxial layer, and the base portion P1 is constituted by a lower portion of the epitaxial layer and the underlying substrate.

Figure 4:
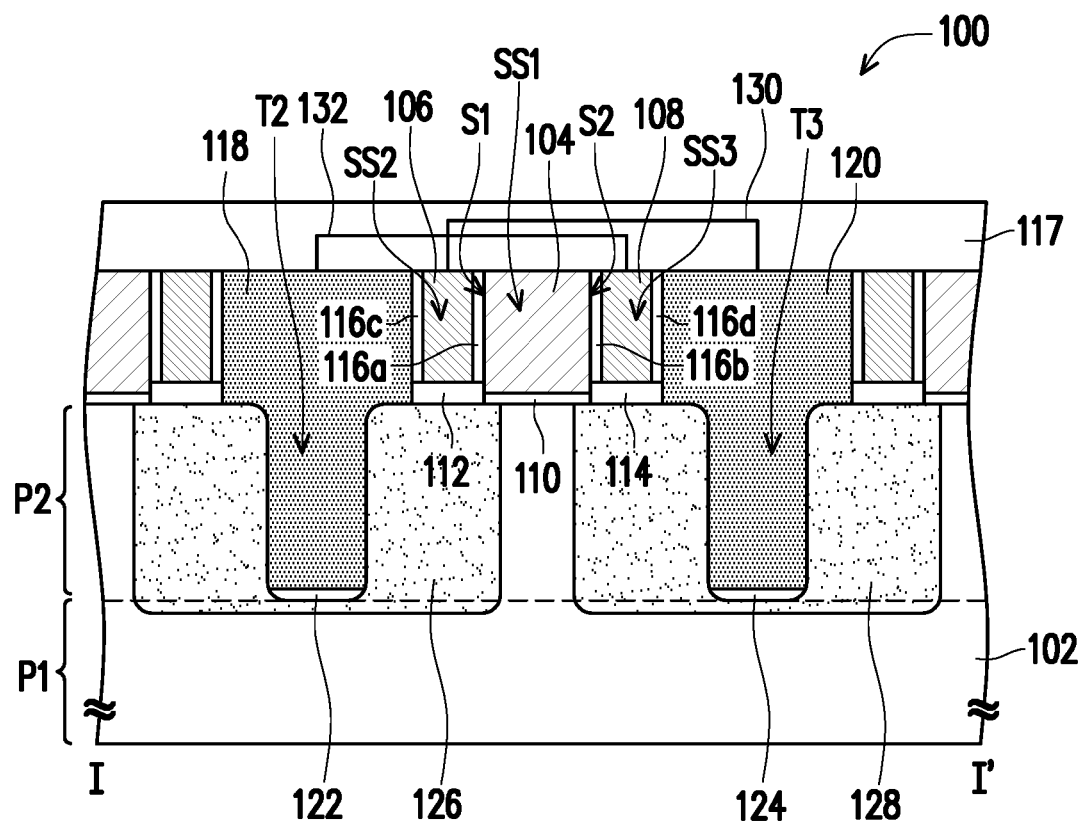
FIG. 4 is a cross-sectional view of a power transistor device sectioned along a sectional line I-I' of FIG. 1 according to an embodiment of the invention.
Figure 5:
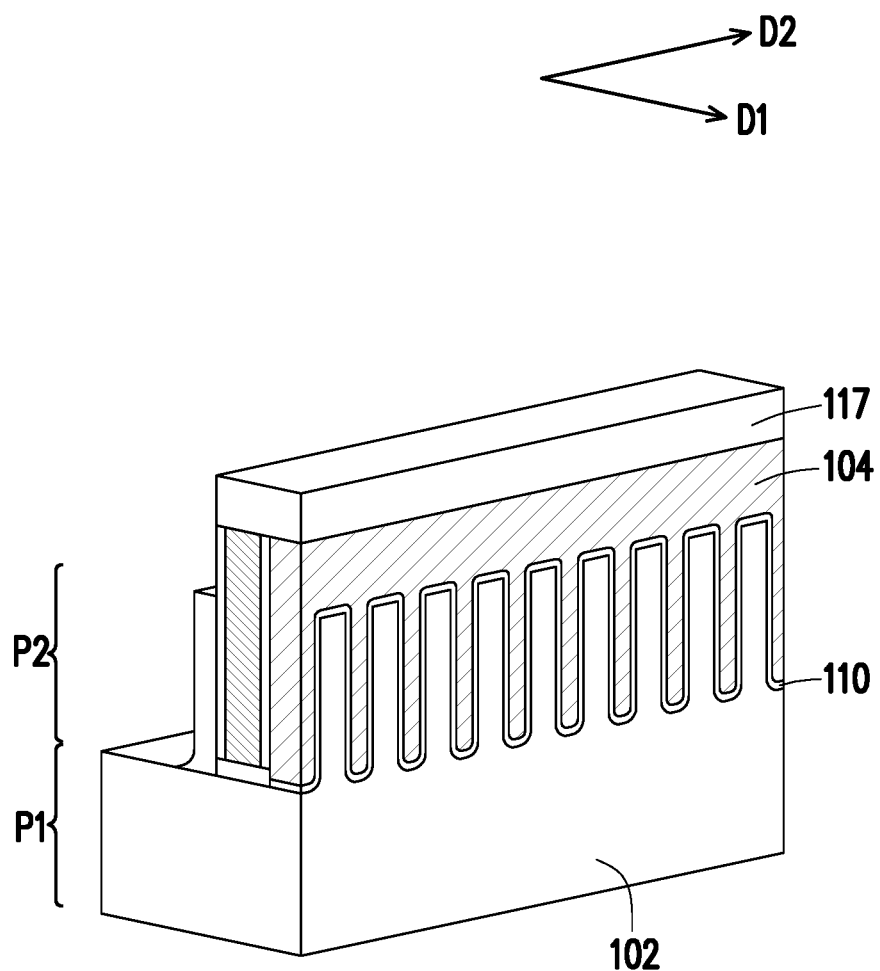
FIG. 5 is a local three-dimensional view of a power transistor device according to an embodiment of the invention.
Figure 6:
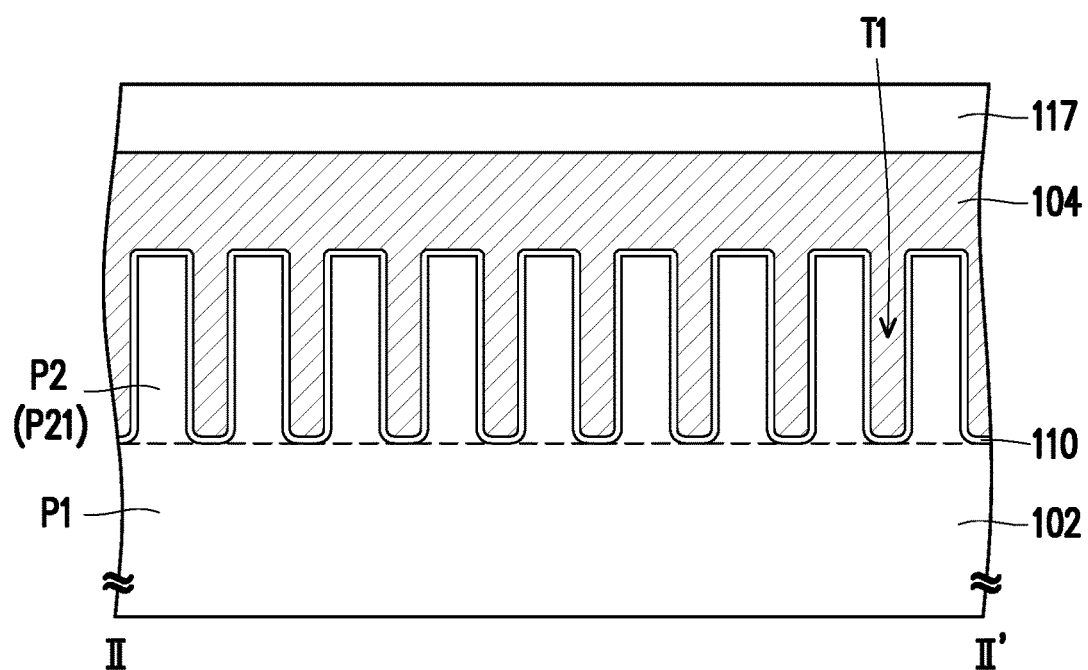
FIG. 6 is a cross-sectional view of a power transistor device sectioned along a sectional line II-II' of FIG. 1 according to an embodiment of the invention.
Figure 7:
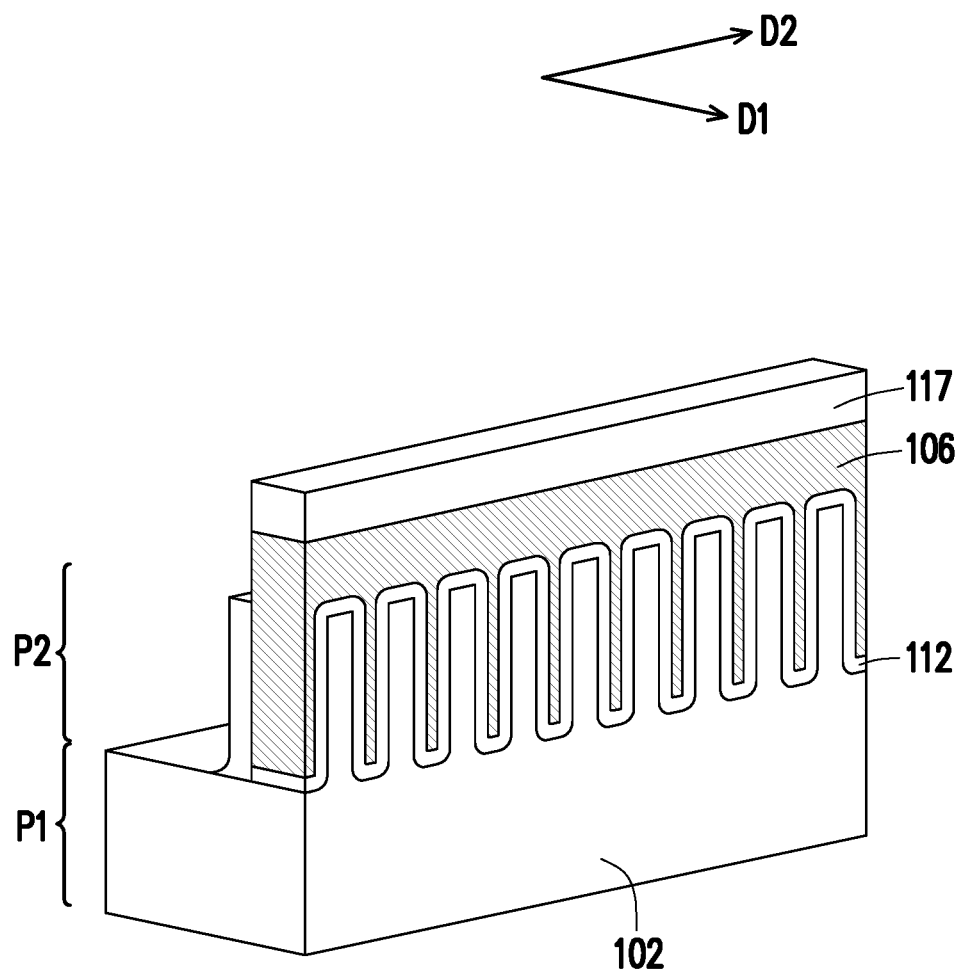
FIG. 7 is a local three-dimensional view of a power transistor device according to an embodiment of the invention.
Figure 8:
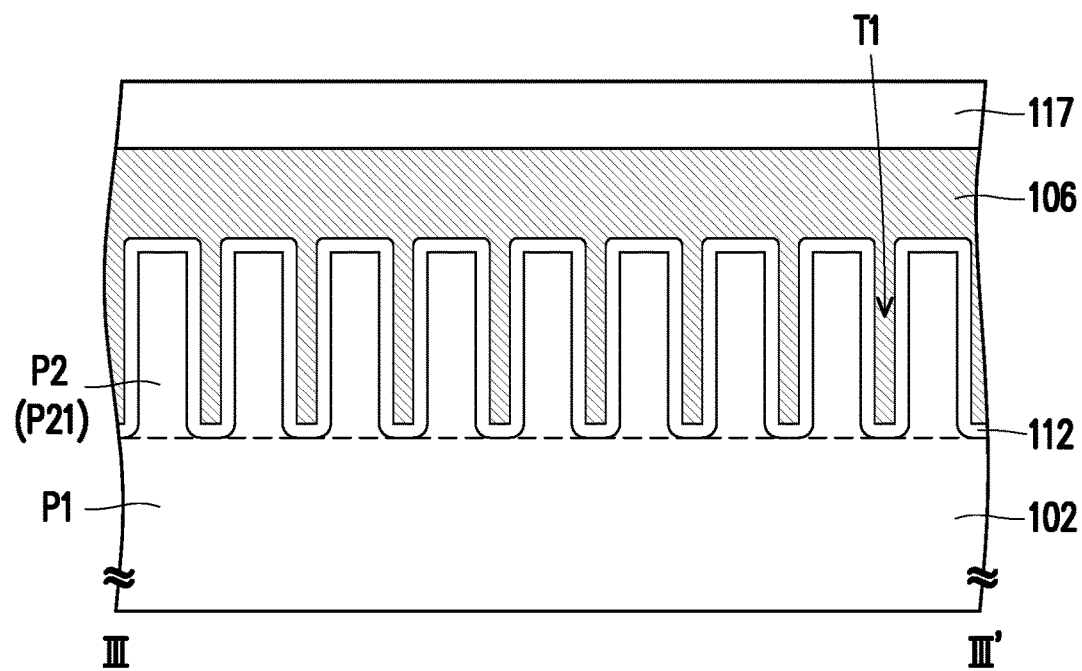
FIG. 8 is a cross-sectional view of a power transistor device sectioned along a sectional line III-III' of FIG. 1 according to an embodiment of the invention.
Figure 9:
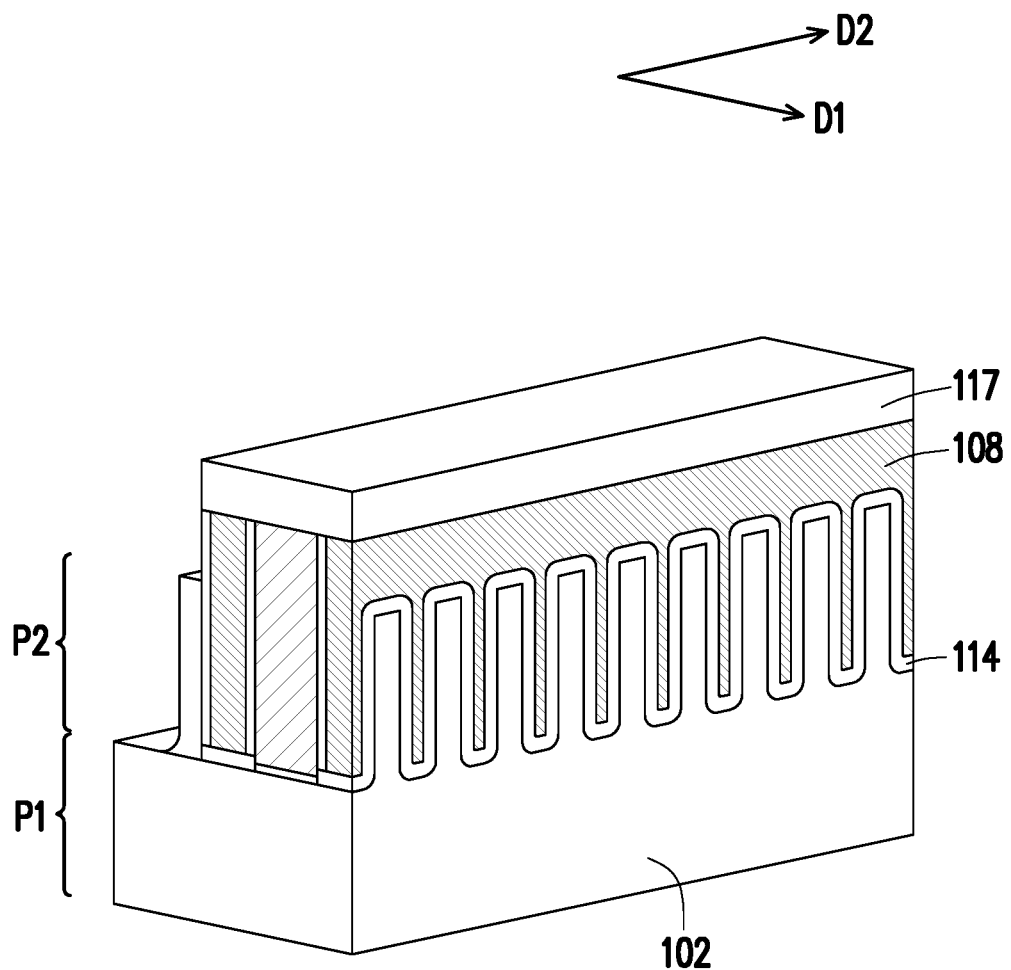
FIG. 9 is a local three-dimensional view of a power transistor device according to an embodiment of the invention.
Figure 10:
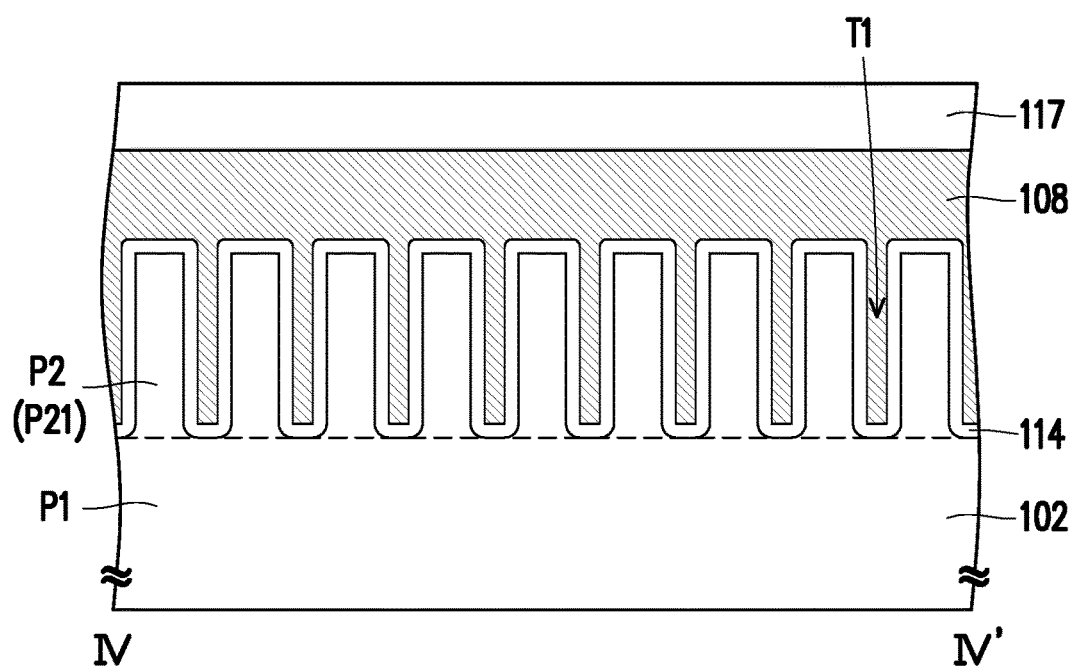
FIG. 10 is a cross-sectional view of a power transistor device sectioned along a sectional line IV-IV' of FIG. 1 according to an embodiment of the invention.

The first conductive layer 104 is disposed across the fin portions P21 and has a first side S1 and a second side S2 opposite to each other, as shown in FIG. 3 and FIG. 4. In this embodiment, the first conductive layer 104 may serve as a gate. When the power transistor device 100 is in operation, a voltage is applied to the first conductive layer 104, and a current flows in the fin portions P2 at this time. The operating principle of the power transistor device 100 is similar to that of a laterally diffused metal oxide semiconductor (LDMOS) transistor. Specifically, the first conductive layer 104 is disposed over the fin portions P21 and fills the first trenches T1 between the fin portions P21. More specifically, the first conductive layer 104 extends along a direction different from the extending direction of the fin portions P21, covers side surfaces and top surfaces of the fin portion P21, and covers the top surface of the base portion P1, as shown in FIG. 5 and FIG. 6. The fin portion P2 protrude from the surface of the base portion P1, which allows the substrate structure 102 to have a large surface area and thereby effectively expands the current channel width effectively as well as reduces the Ron of the power transistor device 100. The material of the first conductive layer 104 includes metal, doped polysilicon, or a combination thereof, for example. In an embodiment, the first conductive layer 104 includes doped polysilicon. The method for forming the first conductive layer 104 includes performing a chemical vapor deposition process followed by photolithography and etching processes.

The second conductive layer 106 and the third conductive layer 108 are respectively disposed across the fin portions P21 and are respectively located at the first side S1 and the second side S2 of the first conductive layer 104. Thereby, each of the second conductive layer 106 and the third conductive layer 108 may serve as a shielding gate for reducing the Ron of the power transistor device 100 effectively. Specifically, each of the second conductive layer 106 and the third conductive layer 108 is disposed over the fin portions P21 and fills in the first trenches T1 between the fin portions P21. More specifically, each of the second conductive layer 106 and the third conductive layer 108 extends along a direction different from the extending direction of the fin portions P21, covers side surfaces and top surfaces of the fin portion P21 and covers the top surface of the base portion P1, as shown in FIG. 7 to FIG. 10. Besides, the first conductive layer 104, the second conductive layer 106 and the third conductive layer 108 may be arranged substantially parallel to each other. The material of each of the second conductive layer 106 and the third conductive layer 108 includes metal, doped polysilicon, or a combination thereof, for example. In an embodiment, each of the second conductive layer 106 and the third conductive layer 108 includes doped polysilicon. The material of the second conductive layer 106 may be the same as or different form the material of the third conductive layer 108. The method for forming the second conductive layer 106 and the third conductive layer 108 includes performing a chemical vapor deposition process followed by photolithography and etching processes.

In an embodiment, the doping type of the first conductive layer 104 may be the same as or different from the doping type of the second conductive layer 106 or the third conductive layer 108. In an embodiment, each of the first, second and third conductive layers 104, 106 and 108 is a P-type doped polysilicon layer. In another embodiment, the first conductive layer 104 is a P-type doped polysilicon layer, while the second and third conductive layers 106 and 108 are N-type doped polysilicon layers. In yet another embodiment, each of the first, second and third conductive layers 104, 106 and 108 is an N-type doped polysilicon layer. In still another embodiment, the first conductive layer 104 is an N-type doped polysilicon layer, while the second and third conductive layers 106 and 108 are P-type doped polysilicon layers.

The first, second and third conductive layers 104, 106 and 108 may be separated from the underlying fin portions P21. In an embodiment, the power transistor device 100 may further include a first dielectric layer 110, a second dielectric layer 112 and a third dielectric layer 114. The first dielectric layer 110 is disposed between the first conductive layer 104 and the fin portions P21 of the substrate structure 102, such that the first conductive layer 104 and the fin portions P21 are separated from each other. The second dielectric layer 112 is disposed between the second conductive layer 106 and the fin portions P21 of the substrate structure 102, such that the second conductive layer 106 and the fin portions P21 are separated from each other. The third dielectric layer 114 is disposed between the third conductive layer 108 and the fin portions P21 of the substrate structure 102, such that the third conductive layer 108 and the fin portions P21 are separated from each other. The material of each of the first dielectric layer 110, the second dielectric layer 112 and the third dielectric layer 114 includes oxide (e.g., silicon oxide), and the forming method thereof includes performing at least one oxidation process or chemical vapor deposition process.

In addition, the first dielectric layer 110, the second dielectric layer 112, and the third dielectric layer 114 may have the same thickness or different thicknesses. In an embodiment, as shown in FIG. 4, the thickness of the first dielectric layer 110 is less than the thickness of the second dielectric layer 112 or the thickness of the third dielectric layer 114, whereby the breakdown voltage of the power transistor device 100 may be increased. However, the present invention is not limited thereto. In another embodiment, the thickness of the first dielectric layer 110 is substantially the same as the thickness of the second dielectric layer 112 or the thickness of the third dielectric layer 114, as shown in a power transistor device 101 of FIG. 11. Besides, upon the process requirements, the thickness of the second dielectric layer 112 may be the same as or different from the thickness of the third dielectric layer 114.

The first conductive layer 104, the second conductive layer 106 and the third conductive layer 108 may be separated from each other. In an embodiment, the power transistor device 100 may further include a first spacer 116a, a second spacer 116b, a third spacer 116c and a fourth spacer 116d. In an embodiment, the first spacer 116a, the second spacer 116b, the third spacer 116c and the fourth spacer 116d are located between the second trench T2 and the third trench T3, and all extend along the second direction D2. The first spacer 116a and the second spacer 116b form a first space SS1. The first spacer 116a and the third spacer 116c form a second space SS2. The second spacer 116b and the fourth spacer 116d form a third space SS3. The first conductive layer 104 is disposed in the first space SS1. The second conductive layer 106 is disposed in the second space SS2. The third conductive layer 108 is disposed in the third space SS3. In an embodiment, the first conductive layer 104, the second conductive layer 106, and the third conductive layer 108 may completely fill the first space SS1, the second space SS2 and the third space SS3, respectively.

The first conductive layer 104 may be electrically insulated from or separated from the second conductive layer 106 by the first spacer 116a, and the first conductive layer 104 may be electrically insulated from or separated from the third conductive layer 108 by the second spacer 116b. In an embodiment, the first spacer 116a is disposed between and in physical contact with the first and second conductive layers 104 and 106, and the second spacer 116b is disposed between and in physical contact with the first and third conductive layers 104 and 108.

In addition, the first spacer 116a, the second spacer 116b, the third spacer 116c and the fourth spacer 116d may be independent components or may be integrally formed. In an embodiment, the method of forming the first spacer 116a and the second spacer 116b includes performing a chemical vapor deposition process followed by an anisotropic etching process, and the method of forming the third spacer 116c and the fourth spacer 116d includes performing another chemical vapor deposition process followed by another anisotropic etching process.

In an embodiment, the power transistor device 100 may further include a fourth conductive layer 118, a fifth conductive layer 120, a fourth dielectric layer 122 and a fifth dielectric layer 124. The fourth conductive layer 118 and the fifth conductive layer 120 are disposed on the base portion P1 at two sides of the fin portions P21 and may respectively serve as a source and a drain of the power transistor device 100. The fourth conductive layer 118 is located at the first side S1 of the first conductive layer 104, and the fifth conductive layer 120 is located at the second side S2 of the first conductive layer 104. For instance, the fourth conductive layer 118 may be disposed in the second trench T2 of the substrate structure 102, and the fifth conductive layer 120 may be disposed in the third trench T3 of the substrate structure 102, so as to provide a bidirectionally conductive power transistor device. The material of each of the fourth conductive layer 118 and the fifth conductive layer 120 includes metal, doped polysilicon, or a combination thereof, for example. In an embodiment, each of the fourth conductive layer 118 and the fifth conductive layer 120 includes metal. The method for forming the fourth conductive layer 118 and the fifth conductive layer 120 includes performing a chemical vapor deposition process followed by a planarization process. The top surface of the fourth conductive layer 118 and the top surface of the fifth conductive layer 120 may be higher than the top surfaces of the fin portions P2. In an embodiment, the top surfaces of the fourth and fifth conductive layers 118 and 120 may be substantially coplanar with the top surfaces of the first, second and third conductive layers 104, 106 and 108.

From another point of view, the fourth conductive layer 118 is disposed between the fin portions P21 and the second fin portions P22, and the fifth conductive layer 120 is disposed between the fin portions P21 and the fin portions P23. Specifically, the fourth conductive layer 118 extends along the second direction D2, is located adjacent to the second conductive layer 106, and is disposed across end parts of the fin portions P21 and end parts of the fin portions P22. The fifth conductive layer 120 extends along the second direction D2, is located adjacent to the third conductive layer 108, and is disposed across end parts of the fin portions P21 and end parts of the fin portions P23.

The fourth conductive layer 118 may be electrically insulated from or separated from the second conductive layer 106 by the third spacer 116c, and the fifth conductive layer 120 may be electrically insulated from or separated from the third conductive layer 108 by the fourth spacer 116d. In an embodiment, the third spacer 116c is disposed between and in physical contact with the second conductive layer 106 and the fourth conductive layer 118, and the fourth spacer 116d is disposed between and in physical contact with the third conductive layer 108 and the fifth conductive layer 120.

The fourth dielectric layer 122 and the fifth dielectric layer 124 are disposed respectively at the bottom of the fourth conductive layer 118 and at the bottom of the fifth conductive layer 120. In other words, the fourth dielectric layer 122 and the fifth dielectric layer 124 may be respectively located at a bottom portion of the second trench T2 and a bottom portion of the third trench T3, so as to increase the breakdown voltage of the power transistor device 100. The fourth dielectric layer 122 is located between the fourth conductive layer 118 and the base portion P1, and the fifth dielectric layer 124 is disposed between the fifth conductive layer 120 and the base portion P1. The material of the fourth dielectric layer 122 and the fifth dielectric layer 124 includes oxide (e.g., silicon oxide), and the forming method thereof includes performing a wet oxidation process or a chemical vapor deposition process. Besides, upon the process requirements, the thickness of the fourth dielectric layer 122 may be the same as or different from the thickness of the fifth dielectric layer 124.

In an embodiment, the power transistor device 100 may further include a top dielectric layer 117, a first well region 126 and a second well region 128. The top dielectric layer 117 may cover the top surfaces of the first conductive layer 104, the second conductive layer 106, the third conductive layer 108, the fourth conductive layer 118 and the fifth conductive layer 120. The material of the top dielectric layer 117 includes oxide (e.g., silicon oxide), and the forming method thereof includes performing a chemical vapor deposition process.

In addition, the second conductive layer 106 may be near the fourth conductive layer 118 and may be electrically coupled to the fifth conductive layer 120. The third conductive layer 108 may be near the fifth conductive layer 120 and may be electrically coupled to the fourth conductive layer 118. Thereby, the Ron of the power transistor device 100 may be reduced effectively, and the power transistor device 100 may have an improved bidirectional voltage withstanding capability. For instance, the second conductive layer 106 may be electrically coupled to the fifth conductive layer 120 through an interconnect structure 130 in the top dielectric layer 117, and the third conductive layer 108 may be electrically coupled to the fourth conductive layer 118 through an interconnect structure 132 in the top dielectric layer 117. Each of the interconnect structure 130 and the interconnect structure 132 may include a contact, a via, a conductive wire, or a combination thereof. The fourth conductive layer 118 and the fifth conductive layer 120 may further extend onto the top surfaces of the fin portions P2. Specifically, the fourth conductive layer 118 may further extend onto the top surfaces of the fin portions P21 and the top surfaces of the fin portions P22, and the fifth conductive layer 120 may further extend onto the top surfaces of the fin portions P21 and the top surfaces of the fin portions P23. In this embodiment, the top surface of the fourth conductive layer 118 and the top surface of the fifth conductive layer 120 may be higher than the top surfaces of the fin portions P2.

The first well region 126 and the second well region 128 are disposed in the substrate structure 102 separately from each other. The first well region 126 surrounds the fourth conductive layer 118. The second well region 128 surrounds the fifth conductive layer 120. In an embodiment, the first well region 126 may laterally extend to below the second conductive layer 106 and below an edge portion of the first conductive layer 104. The second well region 126 may laterally extend to below the third conductive layer 108 and below another edge portion of the first conductive layer 104. The method for forming the first well region 126 and the second well region 128 includes performing an ion implantation, for example. The first well region 126 and the second well region 128 may be N-type well region regions or P-type well region regions. In this embodiment, the N-type well region regions are taken as an example of the first well region 126 and the second well region 128.

The invention further provides a power transistor device 100/101 that includes a substrate structure 102, a first conductive layer 104 and a second conductive layer 106. The substrate structure 102 has first trenches T1 extending along a first direction D1, a second trench T2 extending along a second direction D2 different from the first direction D1, and a third trench T3 extending along the second direction D2. The substrate structure 102 includes a base portion P1 and fin portions P2 extending along the first direction D1 and protruding from a surface of the base portion P1, and each fin portion P2 is disposed between two adjacent first trenches T1 and between the second trench T2 and the third trench T3. The first conductive layer 104 is disposed across the fin portions P2. The second conductive layer 106 and the third conductive layer 108 are disposed across the fin portions P2 and located at two sides of the first conductive layer 104. Besides, the substrate structure 102, the first conductive layer 104, the second conductive layer 106 and the third conductive layer 108 are separated from each other.

Figure 12:
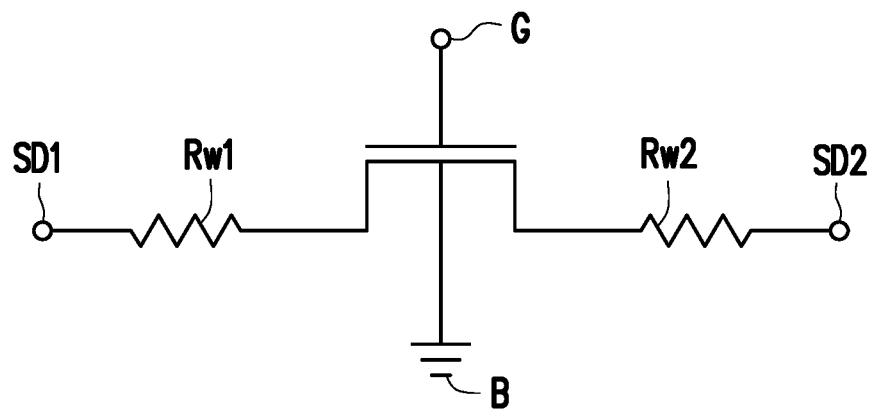
FIG. 12 is a schematic circuit diagram briefly illustrating the power transistor device of FIG. 4.
Figure 13:
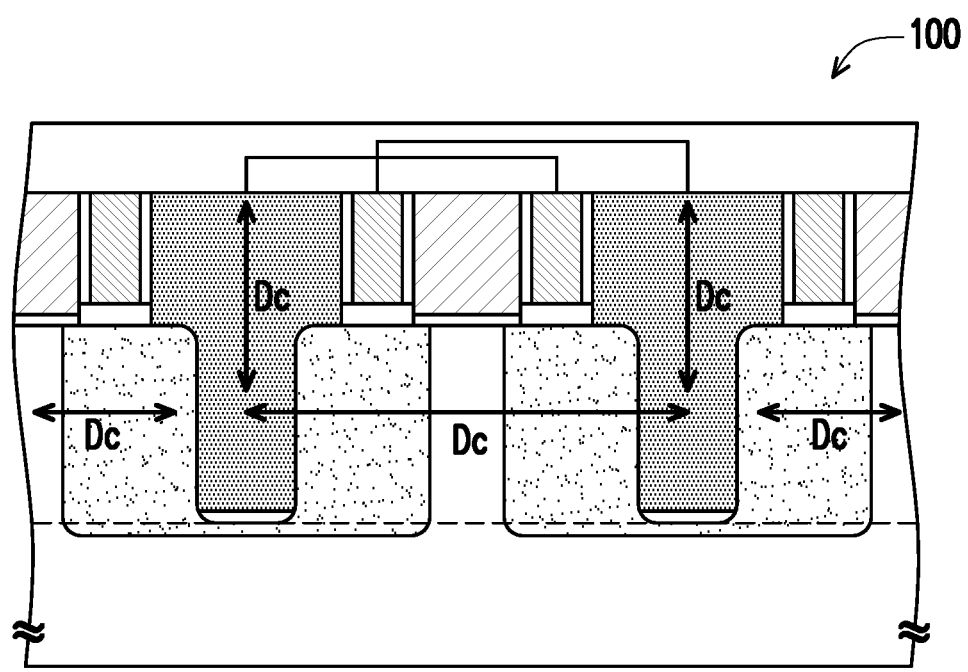
FIG. 13 is a schematic view illustrating a current direction when the power transistor device of FIG. 4 is in operation.

FIG. 12 is a schematic circuit diagram briefly illustrating the power transistor device of FIG. 4. FIG. 13 is a schematic view illustrating a current direction when the power transistor device of FIG. 4 is in operation.

Referring to FIG. 4 to FIG. 12, the power transistor device 100 is a bidirectional transistor device, a gate G may correspond to the first conductive layer 104, a source/drain SD1 and a source/drain SD2 may correspond to the fourth conductive layer 118 and the fifth conductive layer 120, a body B may correspond to the substrate structure 102, and a resistance Rw1 and a resistance Rw2 may respectively represent the resistance of the first well region 126 and the resistance of the second well region 128.

In addition, referring to FIG. 4 to FIG. 13, the power transistor device 100 is a bidirectional transistor device, such that the carrier concentration of the fin portions P2 increases when the power transistor device 100 is in operation, i.e., when a voltage is applied to the first conductive layer 104 (the gate G). Accordingly, the first well region 126 and the second well region 128 are electrically coupled, and the current flows along a current direction Dc.

In the power transistor device 100, the fin portions P2 defined by the first trenches T1, the second trench T2 and the third trench T3 may effectively enlarge the surface area of the substrate structure 102, so as to expand the current channel width for the current flowing in the substrate structure 102, and the Ron of the power transistor device 100 may be further reduced effectively. In addition, the second conductive layer 106 and the third conductive layer 108 are disposed on the fin portions P2 and are respectively located at the first side S1 of the first conductive layer 104 and the second side S2 of the first conductive layer 104, so as to further control the carrier concentration of the fin portions P2 when the power transistor device 100 is in operation. Hence, the Ron of the power transistor device 100 may be reduced more effectively, and the power transistor device 100 having good bidirectional voltage withstanding capability may be provided.

Furthermore, since the second conductive layer 106 may be electrically coupled to the fifth conductive layer 120 through the interconnect structure 130 in the top dielectric layer 117 and the third conductive layer 108 may be electrically coupled to the fourth conductive layer 118 through the interconnect structure 132 in the top dielectric layer 117, the voltage withstanding capability of the power transistor device 100 is increased when the power transistor device 100 is in operation. For instance, during the operation of the power transistor device 100, when the current direction Dc is from the fourth conductive layer 118 to the fifth conductive layer 120, an external voltage (not illustrated) is applied to the fourth conductive layer 118 and the third conductive layer 108, and the second well region 128 in the fin portions P2 has a carrier concentration higher than the carrier concentration of the first well region 126 in the fin portions P2. At this time, if the power transistor device 100 is an open circuit, the carriers of the second well region 128 are attracted by the third conductive layer 108. Thereby, the distance between the first well region 126 and the second well region 128 increases, the breakdown voltage of the power transistor device 100 increases, and vice versa.

To sum up, in the power transistor device described in the above embodiments, the first conductive layer, the second conductive layer, and the third conductive layer are disposed on the fin portions and separated from one another. As such, the Ron of the power transistor device may be reduced effectively, and the bidirectional voltage withstanding capability of the power transistor device may be enhanced effectively.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A power transistor device, comprising:
   a substrate structure, having a base portion and fin portions, wherein the fin portions protrude from a surface of the base portion and extend along a first direction;
   a first conductive layer, disposed across the fin portions and extending along a second direction different from the first direction;
   a second conductive layer, disposed across the same fin portions, located at one side of the first conductive layer and extending along the second direction; and
   a first spacer, disposed between and in physical contact with the first conductive layer and the second conductive layer.

2. The power transistor device according to claim 1, further comprising:
   a first dielectric layer, disposed between the first conductive layer and the fin portions; and
   a second dielectric layer, disposed between the second conductive layer and the fin portions.

3. The power transistor device according to claim 2, wherein a thickness the first dielectric layer is different from a thickness of the second dielectric layer.

4. The power transistor device according to claim 2, wherein a thickness the first dielectric layer is the same as a thickness of the second dielectric layer.

5. The power transistor device according to claim 1, further comprising:
   a third conductive layer, disposed across the fin portions, located at another side of the first conductive layer and extending along the second direction; and
      a second spacer, disposed between and in physical contact with the first conductive layer and the third conductive layer.

6. The power transistor device according to claim 5, further comprising:
   a fourth conductive layer and a fifth conductive layer, disposed on the base portion at outer sides of the second and third conductive layers.

7. The power transistor device according to claim 6, wherein the second conductive layer is electrically coupled to the fifth conductive layer, and the third conductive layer is electrically coupled to the fourth conductive layer.

8. The power transistor device according to claim 6, wherein the fourth conductive layer and the fifth conductive layer further extend onto top surfaces of the fin portions.

9. The power transistor device according to claim 6, further comprising:
   a third spacer, disposed between and in physical contact with the second conductive layer and the fourth conductive layer; and
   a fourth spacer, disposed between and in physical contact with the third conductive layer and the fifth conductive layer.

10. The power transistor device according to claim 6, further comprising:
    a fourth dielectric layer, disposed between fourth conductive layer and the base portion; and
    a fifth dielectric layer, disposed between the fifth conductive layer and the base portion.

11. The power transistor device according to claim 6, further comprising:
    a first well region and a second well region, disposed in the substrate structure separately from each other, wherein the first well region surrounds the fourth conductive layer, and the second well region surrounds the fifth conductive layer.

12. A power transistor device, comprising:
    a substrate structure having first fin portions, second fin portions and third fin portions extending along a first direction, wherein the first fin portions are between and separated from the second fin portions and the third fin portions;
    a first conductive layer, disposed across the first fin portions;
    a second conductive layer and a third conductive layer, disposed across the first fin portions and at two sides of the first conductive layer;
    a fourth conductive layer, disposed between the first fin portions and the second fin portions; and
    a fifth conductive layer, disposed between the first fin portions and the third fin portions.

13. The power transistor device according to claim 12, further comprising:
    a first dielectric layer, disposed between the first conductive layer and the substrate structure;
    a second dielectric layer, disposed between the second conductive layer and the substrate structure; and
    a third dielectric layer, disposed between the third conductive layer and the substrate structure,
    wherein a thickness of the first dielectric layer is less than a thickness of the second dielectric layer or the third dielectric layer.

14. The power transistor device according to claim 12, wherein the first conductive layer and the second conductive layer are spaced from each other by a first spacer, and the first conductive layer and the third conductive layer are spaced from each other by a second spacer.

15. The power transistor device according to claim 12, wherein the second conductive layer and the fourth conductive layer are spaced from each other by a third spacer, and the third conductive layer and the fifth conductive layer are spaced from each other by a fourth spacer.

16. The power transistor device according to claim 15, wherein the second conductive layer is electrically coupled to the fifth conductive layer, and the third conductive layer is electrically coupled to the fourth conductive layer.

17. The power transistor device according to claim 12, further comprising:
- a fourth dielectric layer, disposed between fourth conductive layer and the base portion;
- a fifth dielectric layer, disposed between the fifth conductive layer and the base portion;
- a first well region, disposed in the substrate structure and surrounding the fourth conductive layer; and
- a second well region, disposed in the substrate structure and surrounding the fifth conductive layer.

18. A power transistor device, comprising:
- a substrate structure having first trenches extending along a first direction, a second trench extending along a second direction different from the first direction, and a third trench extending along the second direction, wherein the substrate structure comprises a base portion and fin portions extending along the first direction and protruding from a surface of the base portion, and each fin portion is disposed between two adjacent first trenches and between the second trench and the third trench;
- a first conductive layer, disposed across the fin portions;
- a second conductive layer and a third conductive layer, disposed across the fin portions and located at two sides of the first conductive layer,
- wherein the substrate structure, the first conductive layer, the second conductive layer and the third conductive layer are separated from each other.

19. The power transistor device according to claim 18, wherein the first conductive layer and the second conductive layer are separated by a first spacer, and the first conductive layer and the third conductive layer are separated by a second spacer.

20. The power transistor device according to claim 18, wherein the first conductive layer and the substrate structure are separated by a first dielectric layer, the second conductive layer and the substrate structure are separated by a second dielectric layer, and the third conductive layer and the substrate structure are separated by a third dielectric layer.

* * * * *